(12) United States Patent
Ong et al.

(10) Patent No.: US 8,546,929 B2
(45) Date of Patent: Oct. 1, 2013

(54) EMBEDDED INTEGRATED CIRCUIT PACKAGE-ON-PACKAGE SYSTEM

(75) Inventors: You Yang Ong, Singapore (SG);
Dioscoro A. Merilo, Singapore (SG);
Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1262 days.

(21) Appl. No.: 11/379,336

(22) Filed: Apr. 19, 2006

(65) Prior Publication Data
US 2007/0246813 A1 Oct. 25, 2007

(51) Int. Cl.
*H01L 23/02* (2006.01)

(52) U.S. Cl.
USPC ........... 257/686; 257/685; 257/723; 257/777; 257/E23.125; 257/E25.001; 257/E25.006; 257/E25.018; 257/E25.021; 257/E25.027; 257/E25.03; 398/164

(58) Field of Classification Search
USPC .................. 257/685, 686, 723, 777, E23.125, 257/E25.001, E25.006, E25.013, E25.018, 257/E25.021, E25.027, E25.03; 398/164
See application file for complete search history.

(56) References Cited

U.S. PATENT DOCUMENTS

| | | | |
|---|---|---|---|
| 6,232,152 B1 | 5/2001 | DiStefano et al. | |
| 6,369,455 B1 | 4/2002 | Ho et al. | |
| 6,740,964 B2 | 5/2004 | Sasaki | |
| 6,759,268 B2 | 7/2004 | Akagawa | |
| 6,798,057 B2 | 9/2004 | Bolkin et al. | |
| 6,998,703 B2 | 2/2006 | Di Stefano | |
| 7,185,426 B1 | 3/2007 | Hiner et al. | |
| 7,368,813 B2 * | 5/2008 | Wakisaka et al. | 257/690 |
| 7,633,765 B1 * | 12/2009 | Scanlan et al. | 361/760 |
| 2004/0070083 A1 * | 4/2004 | Su | 257/778 |
| 2004/0227250 A1 * | 11/2004 | Bolken et al. | 257/777 |
| 2004/0238857 A1 * | 12/2004 | Beroz et al. | 257/232 |
| 2005/0098879 A1 | 5/2005 | Kim | |
| 2005/0110168 A1 | 5/2005 | Chuang | |
| 2005/0224988 A1 | 10/2005 | Tuominen | |
| 2006/0110849 A1 * | 5/2006 | Lee et al. | 438/106 |
| 2006/0145331 A1 | 7/2006 | Cho et al. | |
| 2007/0246806 A1 | 10/2007 | Ong et al. | |

\* cited by examiner

*Primary Examiner* — Meiya Li
(74) *Attorney, Agent, or Firm* — Ishimaru & Associates LLP (57) ABSTRACT

An embedded integrated circuit package-on-package system is provided forming a first integrated circuit package system, forming a second integrated circuit package system, and mounting the second integrated circuit package system over the first integrated circuit package system with the first integrated circuit package system, the second integrated circuit package system, or a combination thereof being an embedded integrated circuit package system or an embedded stacked integrated circuit package system.

20 Claims, 6 Drawing Sheets

EMBEDDED INTEGRATED CIRCUIT PACKAGE-ON-PACKAGE SYSTEM

CROSS-REFERENCE TO RELATED APPLICATIONS

This application is related to concurrently filed U.S. patent application Ser. No. 11/379,332. The application is assigned to STATS ChipPAC Ltd. and is herein incorporated by reference thereto.

TECHNICAL FIELD

The present invention relates generally to a substrate and more particularly to a substrate with integrated circuits.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice, package in package (PIP), package on package (POP), or a combination thereof. The electrical connections to the each of the stacked integrated circuits require space typically formed by spacers, such as silicon or interposers. Current spacers require additional steps and structures, which increases manufacturing costs and decreases manufacturing yields. These spacers also limit the amount of height reduction. Conventional PIP and POP configurations require space for the package integration and/or stack limiting the reduction of the package height.

Numerous approaches embed passive devices and integrated circuit circuits into printed circuit board. Some of these approaches require lamination and press process in conventional printed circuit board manufacturing which can cause damage to the integrated circuits or limit the thinness of the integrated circuits. Other approaches embed integrated circuits in holes formed in the printed circuit board or substrate. However, these approaches have problems such as different materials used for filling the hole from the substrate causing damage to the integrated circuit, embedded connections to the integrated circuits, additional process steps to form connections to the embedded integrated circuit, or a combination thereof.

Thus, a need still remains for an embedded integrated circuit package-on-package system for ultra thin integrated circuits providing low cost manufacturing, improved yields, and reduction of the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an embedded integrated circuit package-on-package system including forming a first integrated circuit package system, forming a second integrated circuit package system, and mounting the second integrated circuit package system over the first integrated circuit package system with the first integrated circuit package system, the second integrated circuit package system, or a combination thereof being an embedded integrated circuit package system or an embedded stacked integrated circuit package system.

Certain embodiments of the invention have other aspects in addition to or in place of those mentioned or are obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 1:
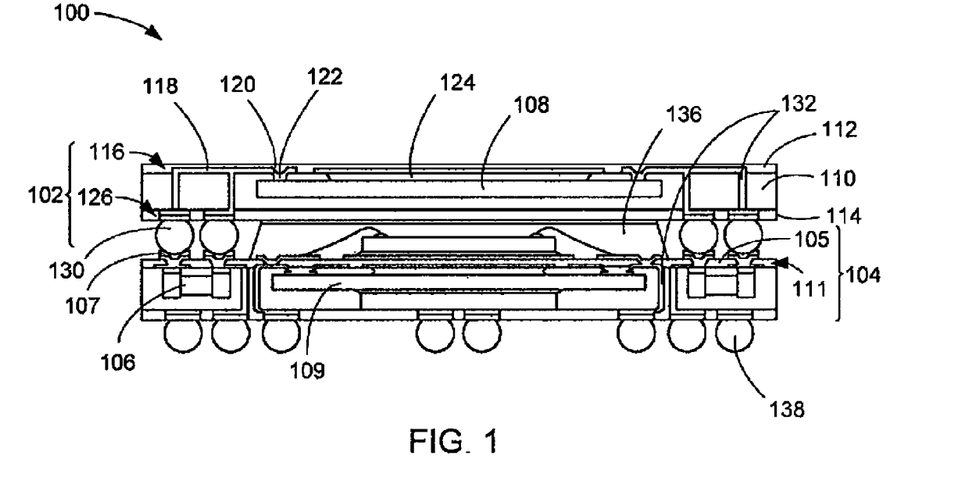
FIG. 1 is a cross-sectional view of a first embedded integrated circuit package-on-package system in an embodiment of the present invention.

Referring now to FIG. 1, therein is shown a cross-sectional view of a first embedded integrated circuit package-on-package system 100 in an embodiment of the present invention. The first embedded integrated circuit package-on-package system 100 includes an embedded integrated circuit package system 102 stack on an embedded stacked integrated circuit package system 104.

The embedded integrated circuit package system 102, such as a second integrated circuit package, includes embedding devices, such as an integrated circuit die 108, which can be an embedded integrated circuit die, in a substrate forming encapsulation 110 between a first circuit structure 112 and a second circuit structure 114. The first circuit structure 112, such as a fiber reinforced substrate or a bismaleimide triazine (BT) substrate, has a first conductive pattern 116. The first conductive pattern 116 includes traces 118 for routing signals and contacts 120 for mounting devices. The contacts 120 may be exposed from the substrate forming encapsulation 110 for further connection.

The integrated circuit die 108 includes bumps 122 on an active side, wherein the bumps 122 connect on the contacts 120. The first conductive pattern 116 also connects to the interior portion of the active side forming a support 124 while serving a number of functions, such as dissipating heat from the integrated circuit die 108 or providing an electromagnetic (EM) shield. The support 124 may optionally include an adhesive between the first conductive pattern 116 and the integrated circuit die 108.

The integrated circuit die 108 is embedded and covered in the substrate forming encapsulation 110, such as an encapsulation having low coefficient of thermal expansion (CTE). The substrate forming encapsulation 110 may be made from a low CTE encapsulant. The low CTE encapsulant may also be a composite with an epoxy and a conventional nonconductive filler, such as silica. The low CTE encapsulant is not electrically conductive and may in a liquid form have the viscosity allowing mold injection or needle dispensing. The composition of the low CTE encapsulant may be adjusted to lessen CTE mismatches avoiding damage to the embedded devices and the other portions of the embedded integrated circuit package system 102.

The second circuit structure 114, such as a fiber reinforced substrate or a bismaleimide triazine (BT) substrate, having a second conductive pattern 126, is on the substrate forming encapsulation 110. A predetermined portion of the second conductive pattern 126 is exposed through the second circuit structure 114 to ambient forming terminal pads 128 and the substrate forming encapsulation 110. Top interconnects 130, such as solder balls, attach to the terminal pads 128 for connection on the embedded stacked integrated circuit package system 104. Electrical vias 132 connect the first conductive pattern 116 and the second conductive pattern 126 in a predetermined configuration.

The embedded stacked integrated circuit package system 104, such as a first integrated circuit package, includes a mold gate 136 on a first structure 105 and a first terminal pad 107 over the first structure 105. The embedded stacked integrated circuit package system 104 also includes external interconnects 138, such as solder balls, on the other surface of the embedded stacked integrated circuit package system 104. The embedded integrated circuit package system 102 mounts on the embedded stacked integrated circuit package system 104 with the mold gate 136 between the top interconnects 130. The top interconnects 130 attach on the embedded stacked integrated circuit package system 104. A first integrated circuit die 109 is connected to the external interconnects 138 through a conductive pattern 111 and the vias 132. The external interconnects 138 attach to the next system level (not shown), such as a printed circuit board or another integrated circuit package.

For illustrative purposes, the first embedded integrated circuit package-on-package system 100 is shown in FIG. 1 with the embedded integrated circuit package system 102 on the embedded stacked integrated circuit package system 104, although it is understood that other configurations are possible. The first embedded integrated circuit package-on-package system 100 may have the embedded stacked integrated circuit package system 104 on the embedded integrated circuit package system 102, or the embedded integrated circuit package system 102 on another of the embedded integrated circuit package system 102, or the embedded stacked integrated circuit package system 104 on another of the embedded stacked integrated circuit package system 104. By this manner any combination of the embedded integrated circuit package system 102, or the embedded stacked integrated circuit package system 104 may be combined to form the first embedded integrated circuit package-on-package system 100.

Figure 2:
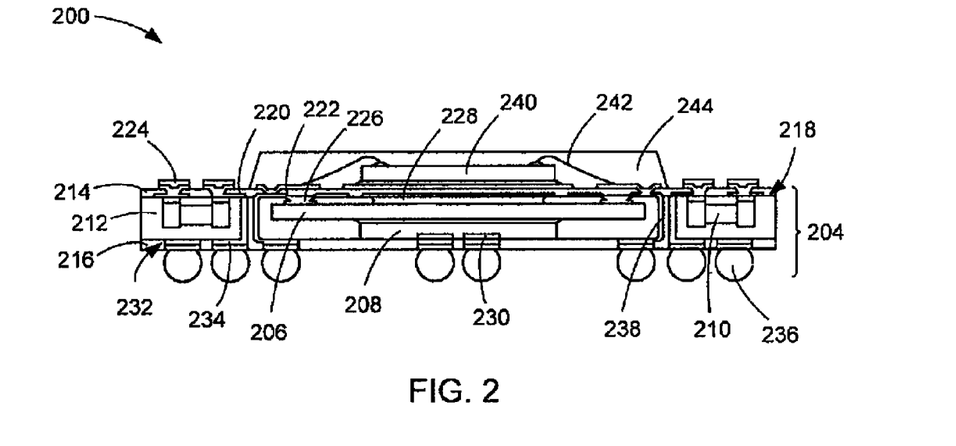
FIG. 2 is a more detailed view of an embedded stacked integrated circuit package system in an embodiment of the present invention.

Referring now to FIG. 2, therein is shown a more detailed view of an embedded stacked integrated circuit package system 200 in an embodiment of the present invention. The embedded stacked integrated circuit package system 200, such as a first integrated circuit package, may represent the embedded stacked integrated circuit package system 104 of FIG. 1 as well as in other embodiments described later. An embedded stacked integrated circuit package system 202 includes an embedded integrated circuit package system 204, such as a substrate having embedded devices, and other devices mounted on the embedded integrated circuit package system 204. The other devices mounted on the top exterior surface of the embedded integrated circuit package system 204 may include an integrated circuit die, such as a wire bond integrated circuit die, discrete components, or a combination thereof.

The embedded integrated circuit package system 204 is a substrate that may embed a first integrated circuit die 206, a second integrated circuit die 208, and discrete components 210, such as resistors, capacitors, or inductors, in a substrate forming encapsulation 212 between a first structure 214 and a second structure 216.

The first structure 214, such as a fiber reinforced substrate or a bismaleimide triazine (BT) substrate, has a first conductive pattern 218, such as a patterned thin copper (Cu) foil, thereon. The first conductive pattern 218 includes traces 220 for routing signals and contacts 222 for mounting devices. First terminal pads 224 are exposed connecting to the first conductive pattern 218 through the first structure 214. The top interconnects 130 of FIG. 1 may be attached between the contacts 120, of FIG. 1, and the first conductive pattern 218 through the first terminal pads 224 as the embedded integrated circuit package system 102 of FIG. 1 mounts on the embedded stacked integrated circuit package system 104.

The first integrated circuit die 206, such as an ultra thin processor die, includes bumps 226 on a first active side, wherein the bumps 226 connect on the contacts 222. The first conductive pattern 218 also connects to the interior portion of the first active side forming a support 228 while serving a number of functions, such as supporting the first integrated circuit die 206 to withstand a stacking process, dissipating heat from the first integrated circuit die 206, or providing an electromagnetic (EM) shield. The support 228 may optionally include an adhesive between the first conductive pattern 218 and the first integrated circuit die 206.

The components 210, such as discrete passive components, also connect on the contacts 222. The second integrated circuit die 208, such as an ultra thin memory die, stacks on the first integrated circuit die 206. A second non-active side of the second integrated circuit die 208 attaches on a first non-active side of the first integrated circuit die 206 with an adhesive, such as a low CTE die-attach adhesive. A second active side of the second integrated circuit die 208 has central bond pads 230 thereon.

For illustrative purposes, the bumps 226 of the first integrated circuit die 206 are shown on peripheral bond pads, although it is understood that the first integrated circuit die 206 may have bond pads in a different configuration, such as an array or a central configuration. Also for illustrative purposes, the second integrated circuit die 208 is shown having the central bond pads 230, although it is understood that the bond pads may be in a different configuration, such as a peripheral or a central configuration. Further for illustrative purposes, the first integrated circuit die 206 is shown larger than the second integrated circuit die 208, although it is understood that the relative sizes may differ.

The first integrated circuit die 206, the components 210, and the second integrated circuit die 208 are embedded and covered in the substrate forming encapsulation 212, such as an encapsulation having low coefficient of thermal expansion (CTE). The substrate forming encapsulation 212 is a composition of the low CTE encapsulant which may be similar to the substrate forming encapsulation 110 of FIG. 1 or adjusted to lessen CTE mismatches avoiding damage to the embedded devices and the other portions of the embedded stacked integrated circuit package system 202.

The second structure 216, such as a fiber reinforced substrate or a bismaleimide triazine (BT) substrate, having a second conductive pattern 232, is on the substrate forming encapsulation 212. A predetermined portion of the second conductive pattern 232 is exposed through the second structure 216 to ambient forming second terminal pads 234 and the substrate forming encapsulation 212. The central bond pads 230 are also exposed to ambient forming a portion part of the second terminal pads 234.

External interconnects 236, such as solder balls, attach to the second terminal pads 234 for connection to the next system level (not shown), such as a printed circuit board or another integrated circuit device. Electrical vias 238 connect the first conductive pattern 218 and the second conductive pattern 232 in a predetermined configuration. The electrical vias 238 may be designed to also form vertical shields surrounding or isolating certain devices in the substrate forming encapsulation 212.

A third integrated circuit die 240, such as an ultra thin integrated circuit die, stacks on the embedded integrated circuit package system 204 on a side opposite the external interconnects 236. Interconnects 242, such as bond wires or solder bumps, connect the third integrated circuit die 240 and the second terminal pads 234 or the traces 220 connected to the second terminal pads 234.

A mold gate 244 covers the third integrated circuit die 240, the interconnects 242, and the second terminal pads 234 connected to the interconnects 242. The mold gate 244 may be made of a number of materials, such as an epoxy mold compound (EMC) or a low CTE encapsulant. The second terminal pads 234 not connected to the third integrated circuit die 240 are left exposed for further connections. The height of the mold gate 244 does not impede mounting connections, such as the top interconnects 130 of FIG. 1.

For illustrative purposes, the mold gate 244 covers a singular die, although it is understood that the mold gate 244 may cover different number and types of devices in various configurations, such as stacked or adjacent to each other. Also for illustrative purposes, the third integrated circuit die 240 is shown electrically connected to the first integrated circuit die 206, although it is understood that the third integrated circuit die may not be electrically connected to the other devices in the embedded stacked integrated circuit package system 200.

Figure 3:
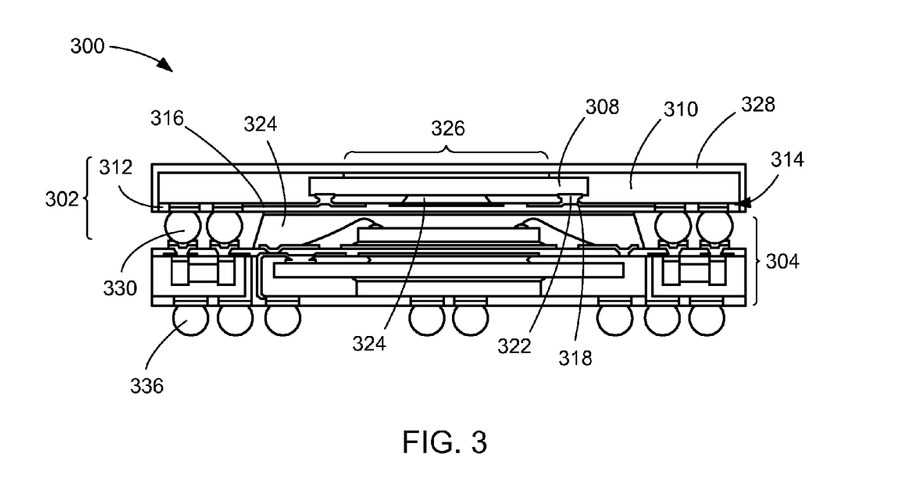
FIG. 3 is a cross-sectional view of a second embedded integrated circuit package-on-package system in an alternative embodiment of the present invention.

Referring now to FIG. 3, therein is shown a cross-sectional view of a second embedded integrated circuit package-on-package system 300 in an alternative embodiment of the present invention. The second embedded integrated circuit package-on-package system 300 includes an embedded integrated circuit package system 302 stack on an embedded stacked integrated circuit package system 304. The embedded stacked integrated circuit package system 304 may be substantially the same to the embedded stacked integrated circuit package system 200 of FIG. 2. The embedded integrated circuit package system 302 includes embedding devices, such as an integrated circuit die 308, in a substrate forming encapsulation 310.

A structure 312, having a conductive pattern 314, is on the substrate forming encapsulation 310. The conductive pattern 314 includes traces 316 for routing signals and contacts 318 for mounting devices. A predetermined portion of the conductive pattern 314 is exposed through the structure 312 to ambient forming terminal pads 320.

The integrated circuit die 308 includes bumps 322 on an active side, wherein the bumps 322 connect on the contacts 318. The conductive pattern 314 also connects to the interior portion of the active side forming a support 324 while serving a number of functions, such as dissipating heat from the integrated circuit die 308 or providing an electromagnetic (EM) shield. The support 324 may optionally include an adhesive between the conductive pattern 314 and the integrated circuit die 308.

The integrated circuit die 308 is embedded and covered in the substrate forming encapsulation 310 with a portion a non-active side of the integrated circuit die 308 exposed through an opening 326 in the substrate forming encapsulation 310. A heat slug 328 attaches to the non-active side and surrounds the substrate forming encapsulation 310 except the side with the structure 312. The conductive pattern 314 may connect the heat slug 328 to ground forming an EM shield with the heat slug 328. Top interconnects 330, such as solder balls, attach to the terminal pads 320 for connection on the embedded stacked integrated circuit package system 304.

The embedded stacked integrated circuit package system 304 includes a mold gate 334 on one of the surface and external interconnects 336, such as solder balls, on the other surface of the embedded stacked integrated circuit package system 304. The embedded integrated circuit package system 302 mounts on the embedded stacked integrated circuit package system 304 with the mold gate 334 between the top interconnects 330. The top interconnects 330 attach on the embedded stacked integrated circuit package system 304. The external interconnects 336 attach to the next system level (not shown), such as a printed circuit board or another integrated circuit package.

For illustrative purposes, the second embedded integrated circuit package-on-package system 300 has the embedded integrated circuit package system 302 on the embedded stacked integrated circuit package system 304, although it is understood that the second embedded integrated circuit package-on-package system 300 may have an embedded stacked integrated circuit package system on an embedded integrated circuit package system, an embedded integrated circuit package system on another embedded integrated circuit package system, or an embedded stacked integrated circuit package system on another embedded stacked integrated circuit package system. Also for illustrative purposes, the second embedded integrated circuit package-on-package system 300 has the embedded integrated circuit package system 302 on the embedded stacked integrated circuit package system 304, although it is understood that the second embedded integrated circuit package-on-package system 300 may have one of the package in the package-on-package configuration as a conventional integrated circuit package system.

Figure 4:
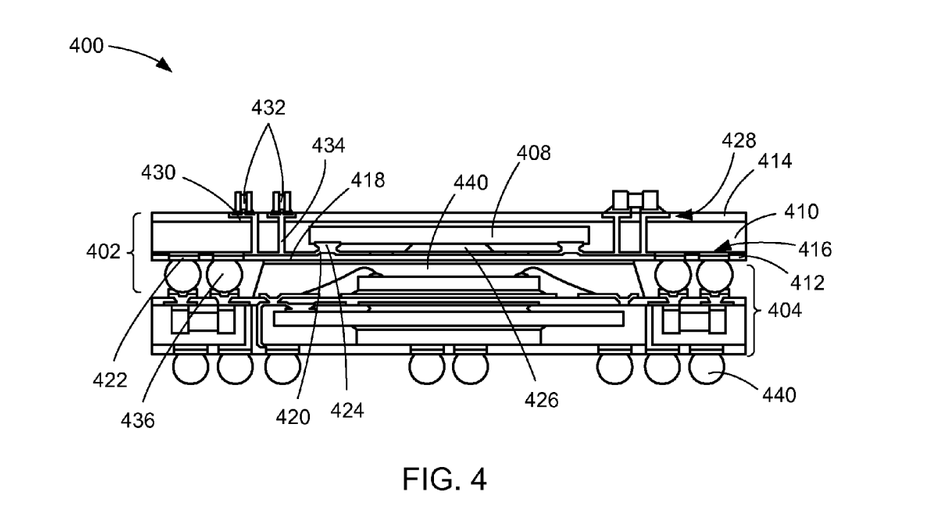
FIG. 4 is a cross-sectional view of a third embedded integrated circuit package-on-package system in another alternative embodiment of the present invention.

Referring now to FIG. 4, therein is shown a cross-sectional view of a third embedded integrated circuit package-on-package system 400 in another alternative embodiment of the present invention. The third embedded integrated circuit package-on-package system 400 includes an embedded integrated circuit package system 402 stack on an embedded stacked integrated circuit package system 404. The embedded stacked integrated circuit package system 404 may be substantially the same to the embedded stacked integrated circuit package system 200 of FIG. 2.

The embedded integrated circuit package system 402 includes embedding devices, such as an integrated circuit die 408, in a substrate forming encapsulation 410 between a first structure 412 and a second structure 414. The first structure 412 has a first conductive pattern 416, wherein the first conductive pattern 416 includes traces 418 for routing signals and contacts 420 for mounting devices. A predetermined portion of the first conductive pattern 416 is exposed through the first structure 412 to ambient forming first terminal pads 422.

The integrated circuit die 408 includes bumps 424 on an active side, wherein the bumps 424 connect on the contacts 420. The first conductive pattern 416 also connects to the interior portion of the active side forming a support 426 while serving a number of functions, such as dissipating heat from the integrated circuit die 408 or providing an electromagnetic (EM) shield. The support 426 may optionally include an adhesive between the first conductive pattern 416 and the integrated circuit die 408.

The second structure 414, such as a fiber reinforced substrate or a bismaleimide triazine (BT) substrate, having a second conductive pattern 428, is on the substrate forming encapsulation 410. A predetermined portion of the second conductive pattern 428 is exposed through the second structure 414 to ambient forming second terminal pads 430 and the substrate forming encapsulation 410. Components 432 connect to the second terminal pads 430. Electrical vias 434 connect the first conductive pattern 416 and the second conductive pattern 428 in a predetermined configuration. Top interconnects 436, such as solder balls, attach to the first terminal pads 422 for connection on the embedded stacked integrated circuit package system 404.

The embedded stacked integrated circuit package system 404 includes a mold gate 440 on one of the surface and external interconnects 442, such as solder balls, on the other surface of the embedded stacked integrated circuit package system 404. The embedded integrated circuit package system 402 mounts on the embedded stacked integrated circuit package system 404 with the mold gate 440 between the top interconnects 436. The top interconnects 436 attach on the embedded stacked integrated circuit package system 404. The external interconnects 442 attach to the next system level (not shown), such as a printed circuit board or another integrated circuit package.

For illustrative purposes, the second embedded integrated circuit package-on-package system 300 has the embedded integrated circuit package system 402 on the embedded stacked integrated circuit package system 404, although it is understood that the third embedded integrated circuit package-on-package system 400 may have an embedded stacked integrated circuit package system on an embedded integrated circuit package system, an embedded integrated circuit package system on another embedded integrated circuit package system, or an embedded stacked integrated circuit package system on another embedded stacked integrated circuit package system. Also for illustrative purposes, the third embedded integrated circuit package-on-package system 400 has the embedded integrated circuit package system 402 on the embedded stacked integrated circuit package system 404, although it is understood that the third embedded integrated circuit package-on-package system 400 may have one of the package in the package-on-package configuration as a conventional integrated circuit package system.

Figure 5:
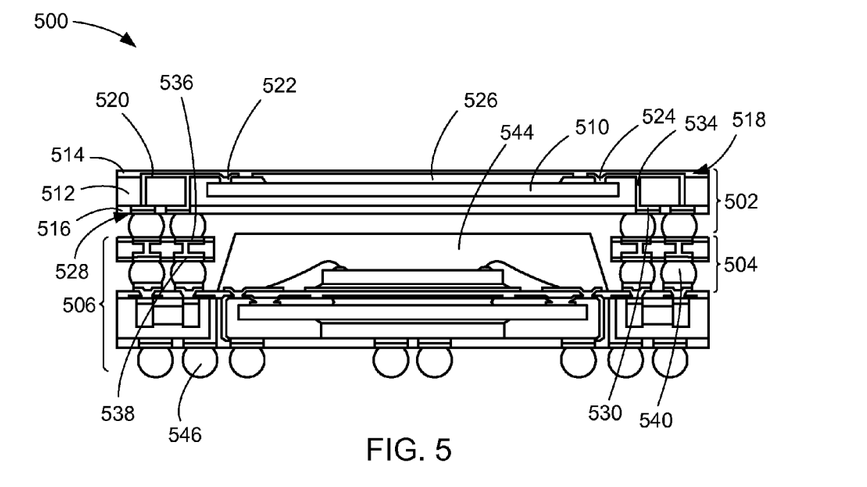
FIG. 5 is a cross-sectional view of a fourth embedded integrated circuit package-on-package system in yet another alternative embodiment of the present invention.

Referring now to FIG. 5, therein is shown a cross-sectional view of a fourth embedded integrated circuit package-on-package system 500 in yet another alternative embodiment of the present invention. The fourth embedded integrated circuit package-on-package system 500 includes an embedded integrated circuit package system 502 stack on an interposer 504. The interposer 504 stacks on an embedded stacked integrated circuit package system 506.

The embedded integrated circuit package system 502 includes embedding an integrated circuit die 510 in a substrate forming encapsulation 512 between a first structure 514 and a second structure 516. The first structure 514 has a first conductive pattern 518. The first conductive pattern 518 includes traces 520 for routing signals and contacts 522 for mounting devices.

The integrated circuit die 510 includes bumps 524 on an active side, wherein the bumps 524 connect on the contacts 522. The first conductive pattern 518 also connects to the interior portion of the active side forming a support 526. The support 526 may optionally include an adhesive between the first conductive pattern 518 and the integrated circuit die 510. The integrated circuit die 510 is embedded and covered in the substrate forming encapsulation 512, such as an encapsulation having low coefficient of thermal expansion (CTE).

The second structure 516, such as a fiber reinforced substrate or a bismaleimide triazine (BT) substrate, having a second conductive pattern 528, is on the substrate forming encapsulation 512. A predetermined portion of the second conductive pattern 528 is exposed through the second structure 516 to ambient forming top package terminal pads 530 and the substrate forming encapsulation 512. Top interconnects 532, such as solder balls, attach to the top package terminal pads 530 for connection on the interposer 504. Electrical vias 534 connect the first conductive pattern 518 and the second conductive pattern 528 in a predetermined configuration.

The interposer 504 includes top terminal pads 536 and bottom terminal pads 538. The top interconnects 532 mount on the top terminal pads 536. Intermediate interconnects 540, such as solder balls, connect to the bottom terminal pads 538. The interposer 504 may serve a number of different functions, such as a spacer or a redistribution layer. Other devices (not shown) may mount on the interposer 504. The interposer 504 may be an embedded integrated circuit package system. The intermediate interconnects 540 mount on the embedded stacked integrated circuit package system 506.

The embedded stacked integrated circuit package system 506 includes a mold gate 544 on one of the surface and external interconnects 546, such as solder balls, on the other surface of the embedded stacked integrated circuit package system 506. The interposer 504 mounts on the embedded stacked integrated circuit package system 506 with the mold gate 544 between the intermediate interconnects 540. The intermediate interconnects 540 attach on the embedded stacked integrated circuit package system 506. The external interconnects 546 attach to the next system level (not shown), such as a printed circuit board or another integrated circuit package.

For illustrative purposes, the fourth embedded integrated circuit package-on-package system 500 has the embedded integrated circuit package system 502 on the embedded stacked integrated circuit package system 506, although it is understood that the fourth embedded integrated circuit package-on-package system 500 may have an embedded stacked integrated circuit package system on an embedded integrated circuit package system, an embedded integrated circuit package system on another embedded integrated circuit package system, or an embedded stacked integrated circuit package system on another embedded stacked integrated circuit package system. Also for illustrative purposes, the fourth embedded integrated circuit package-on-package system 500 has the embedded integrated circuit package system 502 on the embedded stacked integrated circuit package system 506, although it is understood that the fourth embedded integrated circuit package-on-package system 500 may have one of the package in the package-on-package configuration as a conventional integrated circuit package system.

Figure 6:
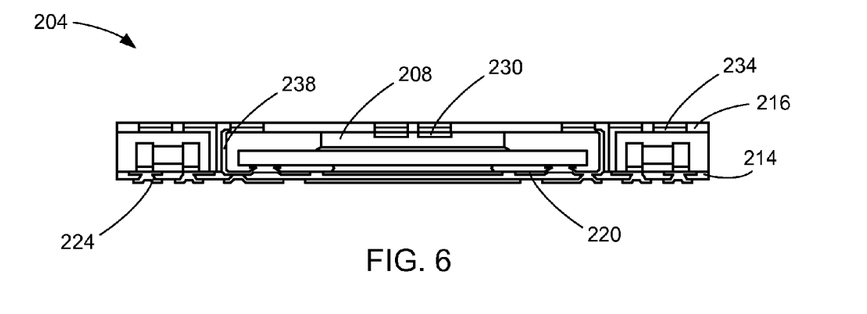
FIG. 6 is a cross-sectional view of the embedded stacked integrated circuit package system of FIG. 2 in a plating phase.

Referring now to FIG. 6, therein is shown a cross-sectional view of the embedded integrated circuit package system 204 of FIG. 2 in a plating phase. Conductive material, such as copper, is plated forming the first terminal pads 224, the second terminal pads 234, the electrical vias 238, and the traces 220 at the exterior of the embedded integrated circuit package system 204. Other materials may optionally be coated on the first terminal pads 224 and the second terminal pads 234 for protection or improved bonding surface. A portion of the second terminal pads 234 connect to the central bond pads 230 of the second integrated circuit die 208. A solder resist is applied on the first structure 214 and the second structure 216 while leaving the first terminal pads 224 and the second terminal pads 234 exposed.

Figure 7:
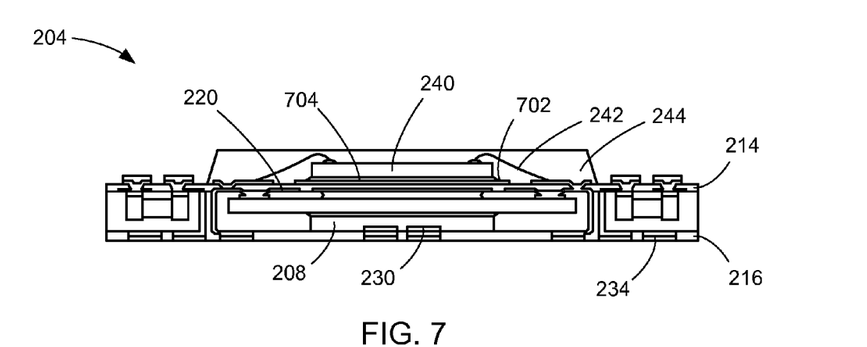
FIG. 7 is the structure of FIG. 6 in a stacking phase.

Referring now to FIG. 7, therein is shown the structure of FIG. 6 in a stacking phase. The embedded integrated circuit package system 204 is vertically flipped from the orientation in FIG. 6. A portion of the traces 220 may be used as a die paddle 702. The third integrated circuit die 240 attaches on the die paddle 702 with an adhesive 704, such as a die-attach adhesive or a low CTE adhesive then cured. The interconnects 242 connect the traces 220 and the third integrated circuit die 240. The mold gate 244 encapsulates the third integrated circuit die 240, the interconnects 242, and the traces 220 as well as the second terminal pads 234 electrically connected to the interconnects 242. The mold gate 244 is also cured. Laser marking may be performed placing identification information on the structure.

Figure 8:
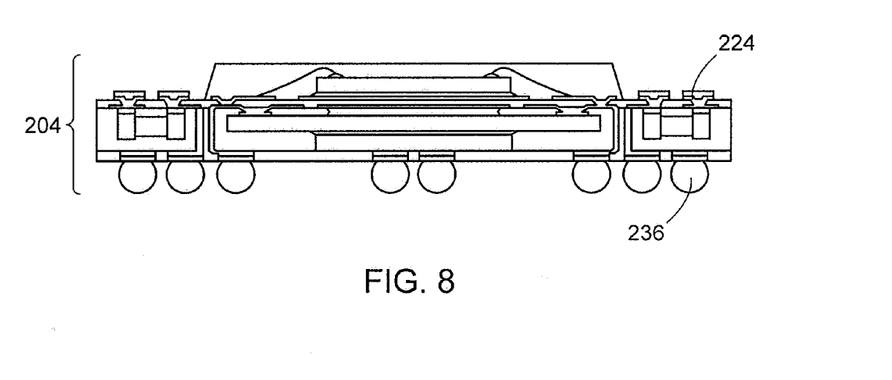
FIG. 8 is the structure of FIG. 7 in a solder ball mount phase.

Referring now to FIG. 8, therein is shown the structure of FIG. 7 in a solder ball mount phase. This phase is optional for embedding stacked integrated circuits in a package used in an electronic system as a printed circuit board. The external interconnects 236, such as solder ball, are reflowed on the first terminal pads 224. The structure undergoes singulation forming the embedded stacked integrated circuit package system 204.

Figure 9:
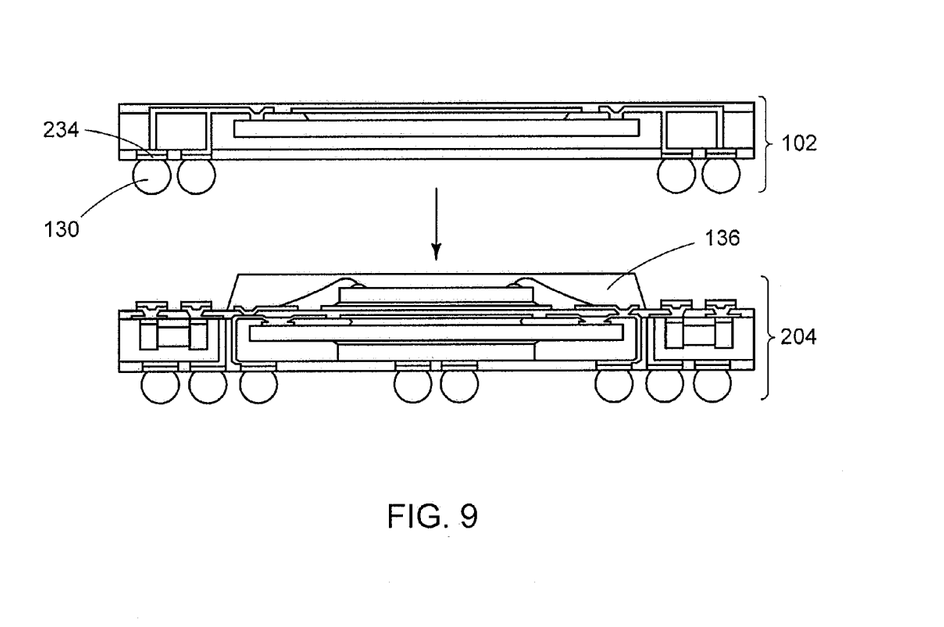
FIG. 9 is the structure of FIG. 8 in a package mount phase.

Referring now to FIG. 9, therein is shown the structure of FIG. 8 in a package mount phase. The embedded integrated circuit package system 102 undergoes mounting on the embedded stacked integrated circuit package system 204. The mold gate 136 does not impede the top interconnects 130 attaching to the second terminal pads 234.

Figure 10:
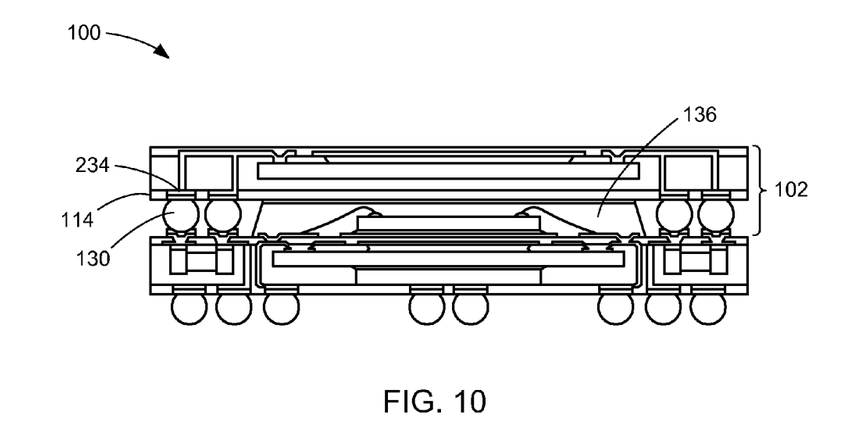
FIG. 10 is the structure of FIG. 9 in a package-on-package formation phase.

Referring now to FIG. 10, therein is shown the structure of FIG. 9 in a package-on-package formation phase. The top interconnects 130 are reflowed on the second terminal pads 234. Laser marking may place identification information on top of the structure forming the first embedded integrated circuit package-on-package system 100.

Figure 11:
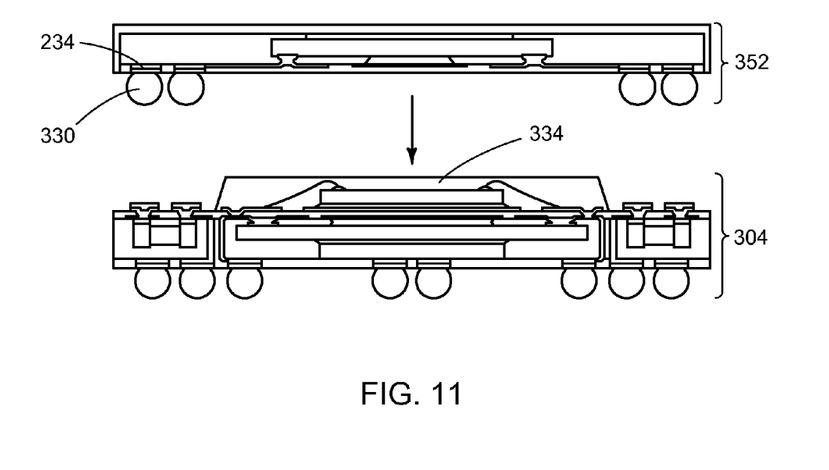
FIG. 11 is the structure of FIG. 8 in an alternative package mount phase.

Referring now to FIG. 11, therein is shown the structure of FIG. 8 in an alternative package mount phase. The embedded integrated circuit package system 302 undergoes mounting on the embedded stacked integrated circuit package system 304. The mold gate 334 does not impede the top interconnects 330 attaching to the second terminal pads 234.

Figure 12:
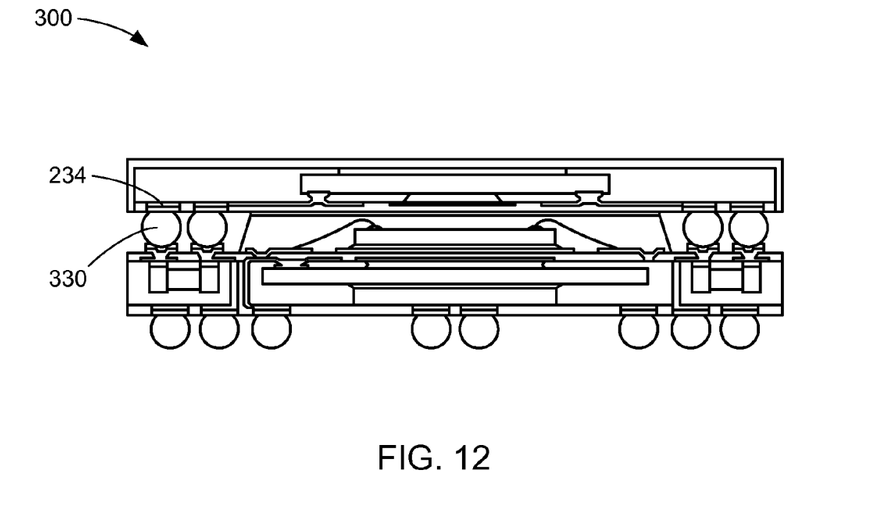
FIG. 12 is the structure of FIG. 11 in an alternative package-on-package formation phase.

Referring now to FIG. 12, therein is shown the structure of FIG. 11 in an alternative package-on-package formation phase. The top interconnects 330 are reflowed on the second terminal pads 234. Laser marking may place identification information on top of the structure forming the second embedded integrated circuit package-on-package system 300.

Figure 13:
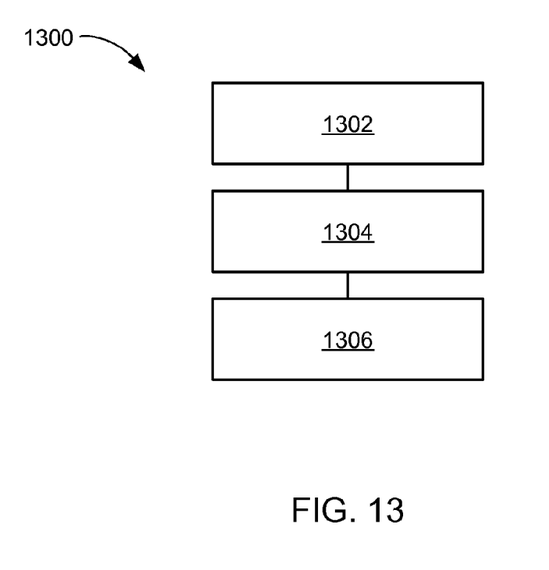
FIG. 13 is a flow chart of an embedded integrated circuit package-on-package system for manufacture of the embedded integrated circuit package-on-package system in an embodiment of the present invention.

Referring now to FIG. 13, therein is shown a flow chart of an embedded integrated circuit package-on-package system 1300 for manufacture of the embedded integrated circuit package-on-package system 100 in an embodiment of the present invention. The system 1300 includes forming a first integrated circuit package system in a block 1302; forming a second integrated circuit package system in a block 1304; and mounting the second integrated circuit package system over the first integrated circuit package system with the first integrated circuit package system, the second integrated circuit package system, or a combination thereof being an embedded integrated circuit package system or an embedded stacked integrated circuit package system in a block 1306.

It has been discovered that the present invention thus has numerous aspects.

It has been discovered that the present invention provides a flexible package system reducing electronic system dimensions as well as mixing different packaging technologies. The embedded integrated circuit package-on-package system enables various devices to mount above or below an embedded integrated circuit system having a low CTE encapsulant.

An aspect is that the present invention provides a package system for integrated circuits to function as a conventional printed circuit board or equivalent structure on a electronic system where other devices may be mounted thereon as well as function as an integrate circuit package. This reduces real estate of the electronic system, simplifies manufacturing processes, reduces the package height, and reduces overall package as well as electronic system cost.

Another aspect of the present invention provides system performance with the embedded components, circuits, and structures. Metallization in the low CTE substrate forming encapsulation may be used to form signal traces, EM shields, passive circuits, or heat slugs, to name a few. Portions of the embedded metallization may be exposed for connection to other devices or for solder ball attachment.

Yet another aspect of the present invention provides shorter signal paths between the embedded devices to further improve system performance and lower system power consumption.

Yet another aspect is that the present invention provides electrical vias that may be formed in an oblique angle with the embedded traces by laser via drilling. This oblique via to embedded trace junction configuration improves signal integrity and system performance, especially for high speed signals by reducing signal reflections back to the driver source.

Yet another aspect is that the low CTE substrate forming encapsulation provides a uniform cover to the embedded integrated circuits and other components to minimize damage to the embedded integrated circuits and the other parts of the package structure. The composition of the low CTE encapsulant may be adjusted as needed.

Yet another aspect of the present invention is mounting devices above or under embedded integrated circuit package system, wherein the device may be another embedded integrated circuit package system, other integrated circuits, such as flip chip or conventionally packaged integrated circuits, or components, such as discrete passive devices. The embedded stacked integrated circuit package system may be formed by stacking other integrated circuits on the embedded integrated circuit package system, wherein the embedded stacked integrated circuit package system may function as a printed circuit board to the other mounting devices.

Thus, it has been discovered that the embedded integrated circuit package-on-package system method of the present invention furnishes important and heretofore unknown and unavailable solutions, capabilities, and functional aspects for improving yield, reliability, and performance in systems. The resulting processes and configurations are straightforward, cost-effective, uncomplicated, highly versatile and effective, can be implemented by adapting known technologies, and are thus readily suited for efficiently and economically manufacturing embedded integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an embedded integrated circuit package-on-package system comprising:
    forming a first integrated circuit package including:
        providing a first structure having a first terminal pad,
        forming a vertical laminated structure including at least a first integrated circuit die on the first structure and a second integrated circuit die on the first integrated circuit die,
        connecting the first integrated circuit die to the first terminal pad and an external interconnect through a conductive pattern and a first vias wherein the conductive pattern and the first vias are formed from the same material,
        molding a substrate forming encapsulation on the first structure and the vertical laminated structure for forming a substrate, and
        mounting a wire bond integrated circuit die to a top surface of the substrate;
    forming a second integrated circuit package including:
        providing an embedded structure having traces and contacts,
        connecting an embedded integrated circuit die to the traces with respective second vias wherein the traces and the respective second vias are formed from the same material, and
        forming an embedded substrate by molding the substrate forming encapsulation on the embedded structure and the embedded integrated circuit die embedded in the embedded substrate and leaving the contacts exposed; and
    mounting the second integrated circuit package over the first integrated circuit package by attaching top interconnects between the first terminal pad and the contacts.

2. The method as claimed in claim 1 wherein:
    forming the first integrated circuit package comprises:
        forming the second integrated circuit package, and
        mounting the wire bond integrated circuit die on a top surface of the second integrated circuit package; and
    further comprising:
    connecting interconnects between the wire bond integrated circuit die and the second integrated circuit package; and
    encapsulating the wire bond integrated circuit die.

3. The method as claimed in claim 1 wherein:
    forming the second integrated circuit package comprises:
        forming an embedded integrated circuit package system; and
        forming a heat slug on an integrated circuit die of the embedded integrated circuit package system.

4. The method as claimed in claim 1 wherein:
    forming the second integrated circuit package comprises:
        forming an embedded integrated circuit package system; and
        mounting a device on the embedded integrated circuit package system.

5. The method as claimed in claim 1 further comprising:
    stacking an interposer on the first integrated circuit package; and
    wherein:
    forming the second integrated circuit package comprises:
        forming an embedded integrated circuit package system; and
    mounting the second integrated circuit package over the first integrated circuit package system further comprises:

mounting the embedded integrated circuit package system on the interposer.

6. A method of manufacturing an embedded integrated circuit package-on-package system comprising:
    forming a first integrated circuit package including:
        providing a first structure having a conductive pattern,
        forming a vertical laminated structure including at least a first integrated circuit die on the first structure and a second integrated circuit die on the first integrated circuit die,
        connecting the first integrated circuit die to the conductive pattern and an external interconnect with a first vias wherein the first vias and the conductive pattern are formed from the same material,
        coupling a component to the conductive pattern,
        molding a substrate forming encapsulation on the first structure, the component, and the vertical laminated structure for forming a substrate, and
        mounting a wire bond integrated circuit die to a top surface of the substrate;
    forming a second integrated circuit package including:
        providing an embedded structure having traces and contacts,
        connecting an embedded integrated circuit die to the traces with respective second vias wherein the respective second vias and the conductive pattern traces are formed from the same material, and
        molding the substrate forming encapsulation on the embedded structure and the embedded integrated circuit die embedded in the embedded substrate and leaving the contacts exposed; and
    mounting the second integrated circuit package over the first integrated circuit package wherein the first integrated circuit package, the second integrated circuit package, or a combination thereof is an embedded integrated circuit package system or an embedded stacked integrated circuit package system.

7. The method as claimed in claim 6 wherein forming the first integrated circuit package includes:
    forming the embedded integrated circuit package system; and
    stacking the first integrated circuit die below a third integrated circuit die.

8. The method as claimed in claim 6 wherein:
    forming the first integrated circuit package having the first integrated circuit die includes:
        forming the embedded integrated circuit package system having a first ultra thin integrated circuit die; and
    forming the second integrated circuit package further includes:
        forming the embedded integrated circuit package system having a second ultra thin integrated circuit die.

9. The method as claimed in claim 6 wherein:
    forming the first integrated circuit package comprises:
        forming the embedded stacked integrated circuit package system; and
    further comprising:
        mounting the external interconnect on the embedded stacked integrated circuit package system.

10. The method as claimed in claim 6 wherein:
    forming the second integrated circuit package comprises:
        forming the embedded integrated circuit package system; and
    further comprising:
        mounting the external interconnect on the embedded integrated circuit package system.

11. An embedded integrated circuit package-on-package system comprising:
    a first integrated circuit package including:
        a first structure having a first terminal pad;
        a vertical laminated structure including at least a first integrated circuit die on the first structure and a second integrated circuit die on the first integrated circuit die,
        the first integrated circuit die connected to the first terminal pad and an external interconnect through a conductive pattern and a first vias wherein the conductive pattern and the first vias are formed from the same material,
        a substrate forming encapsulation molded on the first structure and the integrated circuit die vertical laminated structure for forming a substrate, and
        a wire bond integrated circuit die mounted to a top surface of the substrate;
    a second integrated circuit package including:
        an embedded structure having traces and contacts,
        an embedded integrated circuit die connected to the traces with respective second vias wherein the traces and the respective second vias are formed from the same material, and
        an embedded substrate formed by the substrate forming encapsulation molded on the embedded structure and the embedded integrated circuit die embedded in the embedded substrate and with the contacts exposed; and
    the second integrated circuit package mounted over the first integrated circuit package by top interconnects between the contacts and the first terminal pad.

12. The system as claimed in claim 11 wherein:
    the first integrated circuit package comprises:
        an embedded integrated circuit package system;
        another integrated circuit die on the embedded integrated circuit package system;
        an interconnect between the another integrated circuit die and the embedded integrated circuit package system; and
        an encapsulation to cover the another integrated circuit die and the interconnect.

13. The system as claimed in claim 11 wherein:
    the second integrated circuit package comprises:
        an embedded integrated circuit package system; and
        a heat slug on an integrated circuit die of the embedded integrated circuit package system.

14. The system as claimed in claim 11 wherein:
    the second integrated circuit package comprises:
        an embedded integrated circuit package system; and
        a device on the embedded integrated circuit package system.

15. The system as claimed in claim 11 further comprising:
    an interposer on the first integrated circuit package; and
    wherein:
        the second integrated circuit package comprises:
            an embedded integrated circuit package system; and
            the second integrated circuit package over the first integrated circuit package further comprises:
                the embedded integrated circuit package system on the interposer.

16. The system as claimed in claim 11 wherein:
    the first integrated circuit package includes:
        the first structure having a conductive pattern,
        the first integrated circuit die connected to the conductive pattern;

the first integrated circuit package, the second integrated circuit package, or a combination thereof is an embedded integrated circuit package system or an embedded stacked integrated circuit package system; and, further comprising:
a component coupled to the first conductive pattern.

17. The system as claimed in claim 16 wherein the first integrated circuit package includes:
the embedded integrated circuit package system; and
the wire bond integrated circuit die above below the first integrated circuit die.

18. The system as claimed in claim 16 wherein:
the first integrated circuit package having the first integrated circuit die includes:
the embedded integrated circuit package system having a first ultra thin integrated circuit die; and
the second integrated circuit package further includes:
the embedded integrated circuit package system having a second ultra thin integrated circuit die.

19. The system as claimed in claim 16 wherein:
the first integrated circuit package comprises:
the embedded stacked integrated circuit package system; and
further comprising:
the external interconnect on the embedded stacked integrated circuit package system.

20. The system as claimed in claim 16 wherein:
the second integrated circuit package comprises:
the embedded integrated circuit package system; and
further comprising:
the external interconnect on the embedded integrated circuit package system.

* * * * *

UNITED STATES PATENT AND TRADEMARK OFFICE
CERTIFICATE OF CORRECTION

PATENT NO.         : 8,546,929 B2                                            Page 1 of 1
APPLICATION NO.    : 11/379336
DATED              : October 1, 2013
INVENTOR(S)        : Ong et al.

It is certified that error appears in the above-identified patent and that said Letters Patent is hereby corrected as shown below:

In the Claims:

1. Column 14, Claim 11, line 15, delete "integrated circuit die"

2. Column 15, Claim 17, line 10, delete "below"

Signed and Sealed this
Third Day of May, 2016

Michelle K. Lee
*Director of the United States Patent and Trademark Office*